(12) United States Patent
Ishikawa et al.

(10) Patent No.: US 11,984,329 B2
(45) Date of Patent: May 14, 2024

(54) CERAMIC HEATER

(71) Applicant: NGK INSULATORS, LTD., Nagoya (JP)

(72) Inventors: Masaki Ishikawa, Handa (JP); Shuichiro Motoyama, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 283 days.

(21) Appl. No.: 17/302,080

(22) Filed: Apr. 23, 2021

(65) Prior Publication Data

US 2021/0242048 A1 Aug. 5, 2021

Related U.S. Application Data

(63) Continuation of application No. PCT/JP2019/050259, filed on Dec. 23, 2019.

(30) Foreign Application Priority Data

Jan. 25, 2019 (JP) ................... 2019-011301

(51) Int. Cl.
H01L 21/67 (2006.01)
H05B 1/02 (2006.01)
H05B 3/22 (2006.01)

(52) U.S. Cl.
CPC ..... *H01L 21/67103* (2013.01); *H05B 1/0233* (2013.01); *H05B 3/22* (2013.01); *H05B 2203/005* (2013.01); *H05B 2203/016* (2013.01)

(58) Field of Classification Search
CPC .............. H01L 21/6833; H05B 1/0233; H05B 2203/005; H05B 2203/016; H05B 3/22; H05B 3/265; H05B 3/283

(Continued)

(56) References Cited

U.S. PATENT DOCUMENTS

2003/0075537 A1 4/2003 Okajima et al.
2005/0258160 A1* 11/2005 Goto ................. H01L 21/67103
219/270

(Continued)

FOREIGN PATENT DOCUMENTS

CN 102598212 A 7/2012
JP 2005-063691 A1 3/2005

(Continued)

OTHER PUBLICATIONS

English translation of the International Preliminary Report on Patentability (Chapter I) dated Aug. 5, 2021 (Application No. PCT/JP2019/050259).

(Continued)

*Primary Examiner* — Sang Y Paik
(74) *Attorney, Agent, or Firm* — BURR PATENT LAW, PLLC

(57) ABSTRACT

A ceramic heater includes a ceramic plate. The ceramic plate has a wafer placement surface and has an inner-peripheral-side zone that has a circular shape and an outer-peripheral-side zone that has an annular shape. An inner-peripheral-side resistance heating element that has a two-dimensional shape is disposed in the inner-peripheral-side zone. An outer-peripheral-side is resistance heating element that has a coil shape is disposed in the outer-peripheral-side zone. A terminal of inner-peripheral-side resistance heating element and a terminal of the outer-peripheral-side resistance heating element are disposed in the inner-peripheral-side.

4 Claims, 3 Drawing Sheets

(58) Field of Classification Search
USPC .................................................... 219/444.1
See application file for complete search history.

(56) References Cited

U.S. PATENT DOCUMENTS

| | | | |
|---|---|---|---|
| 2011/0005686 A1* | 1/2011 | Tanaka | H01L 21/67248 156/345.52 |
| 2012/0211933 A1 | 8/2012 | Goto | |

FOREIGN PATENT DOCUMENTS

| | | |
|---|---|---|
| JP | 3897563 B2 | 3/2007 |
| JP | 2009-009795 A1 | 1/2009 |
| JP | 2010-109316 A | 5/2010 |
| JP | 2015-018704 A | 1/2015 |
| TW | 201001592 A1 | 1/2010 |

OTHER PUBLICATIONS

Japanese Office Action (Application No. 2020-567432) dated Sep. 13, 2022 (with English translation).
International Search Report and Written Opinion (Application No. PCT/JP2019/050259) dated Mar. 10, 2020.
Chinese Office Action dated Feb. 15, 2023 (Application No. 2019800776259).
Taiwanese Office Action (Application No. 108147551) dated Apr. 26, 2023.

* cited by examiner

CERAMIC HEATER

BACKGROUND OF THE INVENTION

1. Field of the Invention

The present invention relates to a ceramic heater.

2. Description of the Related Art

For a semiconductor-manufacturing apparatus, a ceramic heater that heats a wafer is used. A so-called two-zone heater is known as such a ceramic heater. In a heater known as this kind of two-zone heater, as disclosed in PTL 1, an inner-peripheral-side resistance heating element and an outer-peripheral-side resistance heating element are embedded in a ceramic base on the same plane, and heat generated from the resistance heating elements is separately controlled by separately applying a voltage to the resistance heating elements. Each resistance heating element includes a coil composed of high-melting-point metal such as tungsten.

CITAION LIST

PATENT LITERATURE

PTL 1: JP 3897563 B

SUMMARY OF THE INVENTION

However, it is necessary to dispose terminals of the inner-peripheral-side resistance heating element and terminals of the outer-peripheral-side resistance heating element in an inner-peripheral-side zone, and it is difficult to wire the inner-peripheral-side resistance heating element that has a coil shape at a high density. For this reason, there is a possibility that temperature variance occurs in the inner-peripheral-side zone.

The present invention has been accomplished to solve the problems, and it is a main object of the present invention to inhibit temperature variance from occurring in an inner-peripheral-side zone.

A ceramic heater according to the present invention includes a ceramic plate that has a wafer placement surface and that has an inner-peripheral-side zone that has a circular shape and an outer-peripheral-side zone that has an annular shape, an inner-peripheral-side resistance heating element that is disposed in the inner-peripheral-side zone and that has a two-dimensional shape, and an outer-peripheral-side resistance heating element that is disposed in the outer-peripheral-side zone and that has a coil shape. A terminal of the inner-peripheral-side resistance heating element and a terminal of the outer-peripheral-side resistance heating element are disposed in the inner-peripheral-side zone.

In the ceramic heater, the outer-peripheral-side resistance heating element that has a coil shape is disposed in the outer-peripheral-side zone, and accordingly, a relatively large amount of heat generation can be obtained. The shape of the inner-peripheral-side resistance heating element is not a coil shape but a two-dimensional shape, and accordingly, a line width can be decreased, and a line distance can be decreased. Accordingly, temperature variance can be inhibited from occurring in the inner-peripheral-side zone.

In the ceramic heater according to the present invention, the inner-peripheral-side resistance heating element may be wired over the entire inner-peripheral-side zone via a space between the terminals. The shape of the inner-peripheral-side resistance heating element is a two-dimensional shape, and accordingly, the line width can be decreased, and the line distance can be decreased. For this reason, the inner-peripheral-side resistance heating element can be wired over the entire inner-peripheral-side zone via the space between the terminals.

In the ceramic heater according to the present invention, an area of the inner-peripheral-side zone may be smaller than an area of the outer-peripheral-side zone. Even in this case, the inner-peripheral-side resistance heating element that has a two-dimensional shape enables the line width to be decreased and the line distance to be decreased, and accordingly, the inner-peripheral-side resistance heating element can be wired over the entire inner-peripheral-side zone.

In the ceramic heater according to the present invention, the inner-peripheral-side resistance heating element and the outer-peripheral-side resistance heating element may be disposed on the same plane parallel with the wafer placement surface in the ceramic plate. The word "parallel" includes not only a case of being completely parallel but also a case of being substantially parallel (for example, a case of being within tolerance). The word "same" includes not only a case of being completely the same but also a case of being substantially the same (for example, a case of being within tolerance).

In the ceramic heater according to the present invention, the inner-peripheral-side zone may be a single zone, and the outer-peripheral-side zone may be divided into two or more zones, and the outer-peripheral-side resistance heating element may be separately wired for every zone. The outer-peripheral-side resistance heating element is separately wired in the two or more zones, and accordingly, the number of the terminal of outer-peripheral-side resistance heating element increases depending on the number of the zones. It is necessary to wire the inner-peripheral-side resistance heating element via an increased number of terminals. Even in this case, the inner-peripheral-side resistance heating element that has a two-dimensional shape enables the line width to be decreased and the line distance to be decreased, and accordingly, the inner-peripheral-side resistance heating element can be wired over the entire inner-peripheral-side zone.

DETAILED DESCRIPTION OF THE INVENTION

Figure 1:
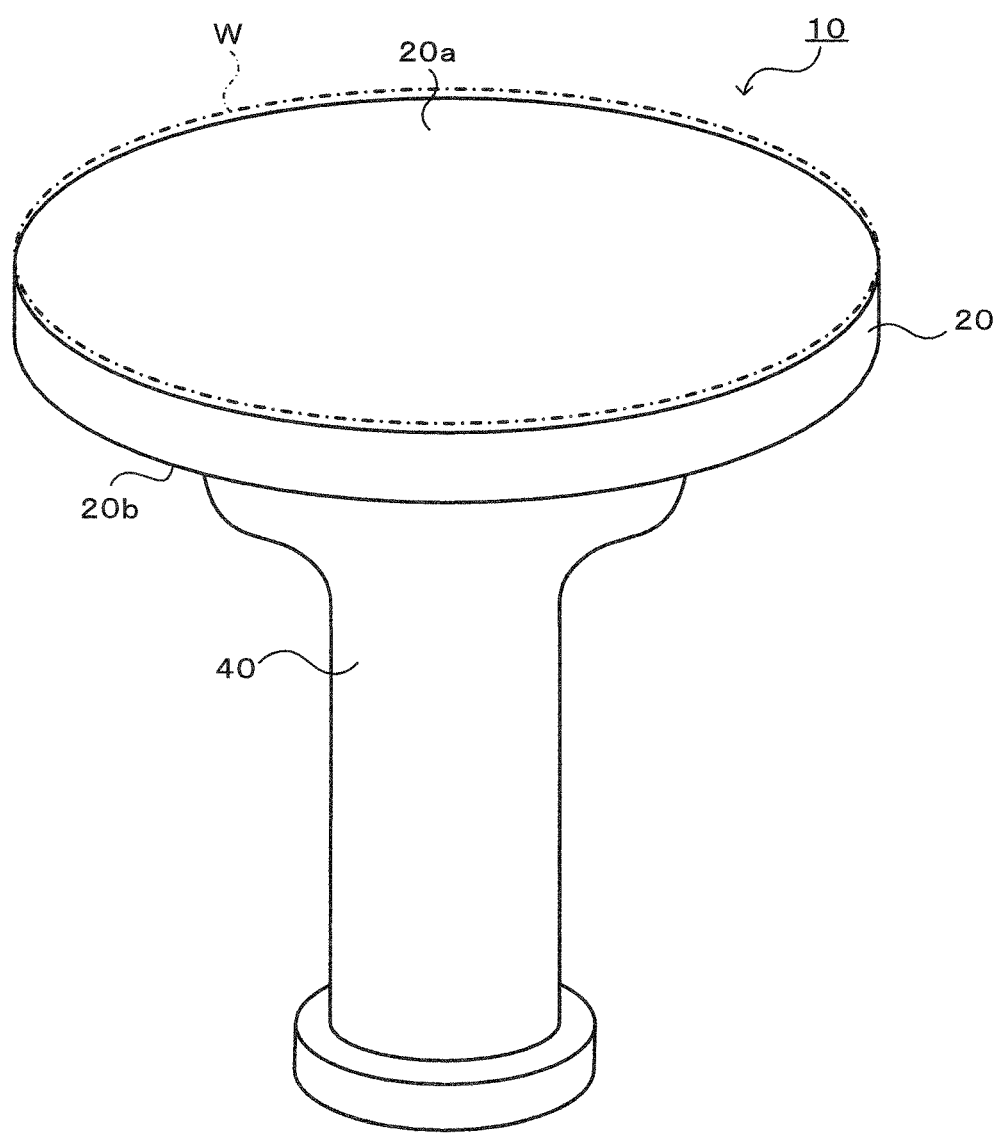
FIG. 1 is a perspective view of a ceramic heater 10.
Figure 2:
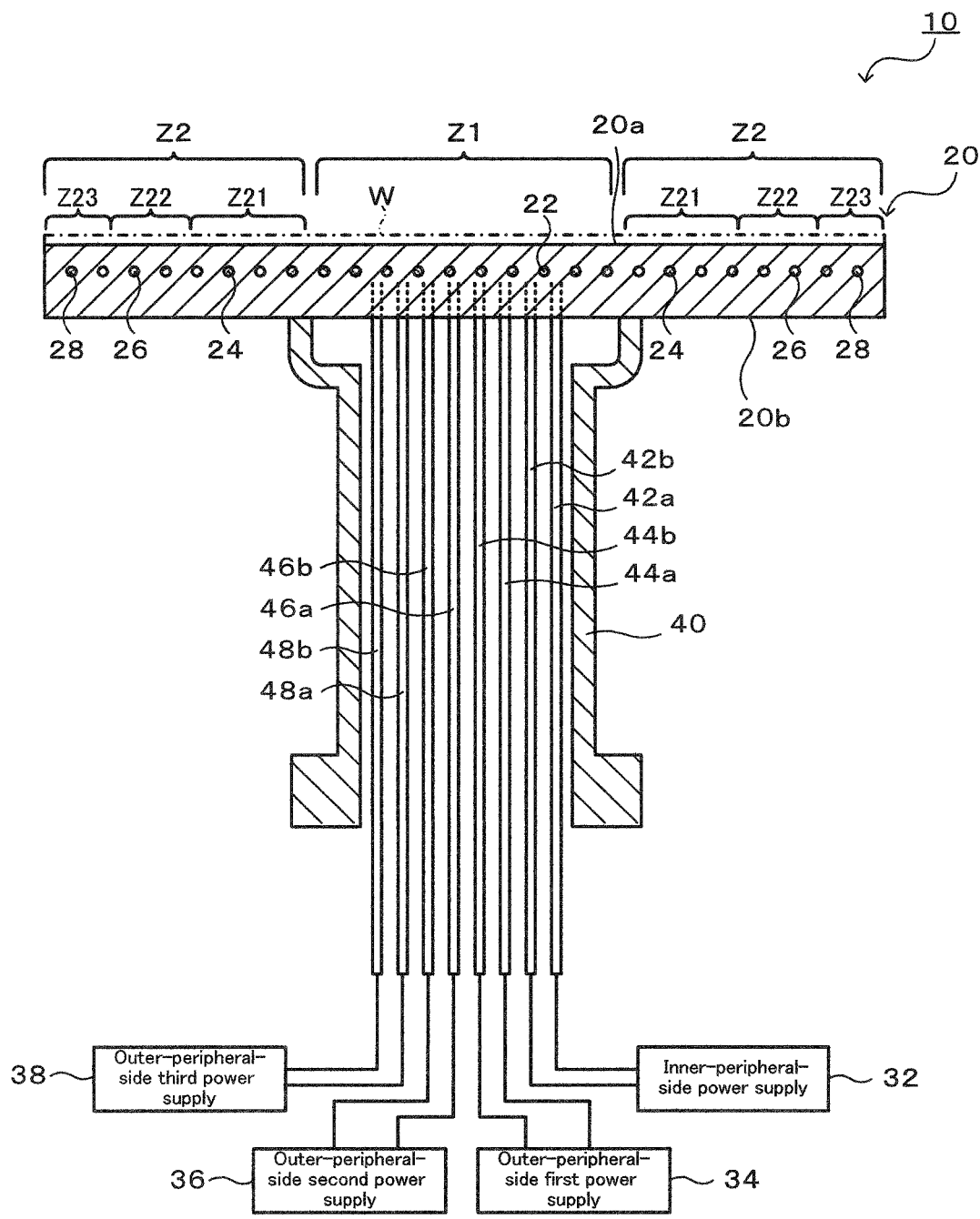
FIG. 2 is a longitudinal sectional view of the ceramic heater 10.
Figure 3:
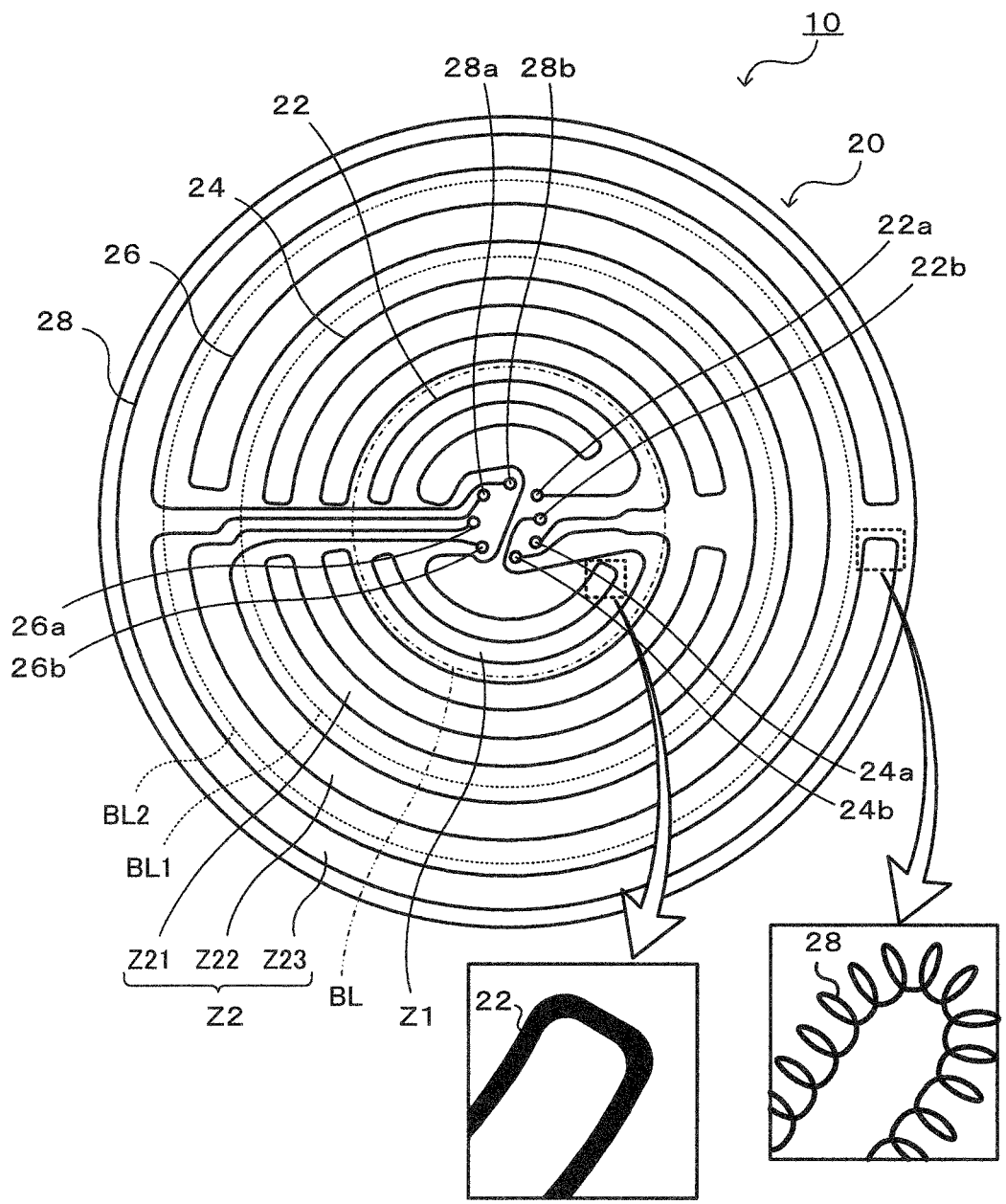
FIG. 3 is a sectional view of a ceramic plate 20 taken along a plane parallel with resistance heating elements 22, 24, 26, and 28 and viewed from above.

A preferred embodiment of the present invention will hereinafter be described with reference to the drawings. FIG. 1 is a perspective view of a ceramic heater 10. FIG. 2 is a longitudinal sectional view (a sectional view of the ceramic heater 10 taken along a plane containing a central axis) of the ceramic heater 10. FIG. 3 is a sectional view of a ceramic plate 20 taken along a plane parallel with resistance heating elements 22, 24, 26, and 28 and viewed from above. FIG. 3 illustrates the ceramic plate 20 substantially viewed from a wafer placement surface 20a. In FIG. 3, hatching representing a section is omitted.

The ceramic heater 10 is used to heat a wafer that is subjected to a process such as etching or CVD and is installed in a vacuum chamber not illustrated. The ceramic heater 10 includes the ceramic plate 20 that has the wafer placement surface 20a and that is discoid, and a tubular shaft 40 that is joined coaxially with the ceramic plate 20 to a surface (a back surface) 20b of the ceramic plate 20 opposite the wafer placement surface 20a.

The ceramic plate 20 is a discoid plate composed of a ceramic material, representatively, aluminum nitride or alumina. The diameter of the ceramic plate 20 is, for example, about 300 mm. Fine irregularities are formed on the wafer placement surface 20a of the ceramic plate 20 by an embossing process, although these are not illustrated. An imaginary boundary BL (see FIG. 3) that is concentric with the ceramic plate 20 divides the ceramic plate 20 into an inner-peripheral-side zone Z1 that has a small circular shape and an outer-peripheral-side zone Z2 that has an annular shape. The diameter of the imaginary boundary BL is, for example, about 200 mm. The area of the inner-peripheral-side zone Z1 is smaller than the area of the outer-peripheral-side zone Z2. The outer-peripheral-side zone Z2 is divided into three annular zones, that is, outer-peripheral-side first to third zones Z21 to Z23 by imaginary boundaries BL1 and BL2 (see FIG. 3) concentric with the ceramic plate 20. The inner-peripheral-side resistance heating element 22 is embedded in the inner-peripheral-side zone Z1 of the ceramic plate 20. The outer-peripheral-side first to third resistance heating elements 24, 26, and 28 are embedded in the respective outer-peripheral-side first to third zones Z21 to Z23. The resistance heating elements 22, 24, 26, and 28 are disposed on the same plane parallel with the wafer placement surface 20a.

As illustrated in FIG. 3, the inner-peripheral-side resistance heating element 22 extends from one of a pair of terminals 22a and 22b disposed on a central portion (a region of the back surface 20b of the ceramic plate 20 that is surrounded by the tubular shaft 40) of the ceramic plate 20 and reaches the other. Here, the inner-peripheral-side resistance heating element 22 extends from the terminal 22a, passes through spaces between terminals 24a, 24b, 26a, 26b, 28a, and 28b, is folded at folded portions in a one-stroke pattern, is wired over the substantially entire inner-peripheral-side zone Z1, and reaches the terminal 22b. The inner-peripheral-side resistance heating element 22 is a heating element that is manufactured by using high-melting-point metal or carbide thereof and that has a two-dimensional shape and is manufactured by, for example, applying paste by printing. Examples of the two-dimensional shape include a ribbon shape (a flat elongated shape) and a mesh shape. Examples of the high-melting-point metal include tungsten, molybdenum, tantalum, platinum, rhenium, hafnium, and an alloy thereof. Examples of the carbide of the high-melting-point metal include tungsten carbide and molybdenum carbide. Since the inner-peripheral-side resistance heating element 22 has a two-dimensional shape, a line width can be decreased, a line distance can be decreased, the distance between the terminals can be increased, and a sectional area can be decreased. For this reason, electric resistance between the terminals of the inner-peripheral-side resistance heating element 22 can be readily adjusted by adjusting these.

As illustrated in FIG. 3, the outer-peripheral-side first resistance heating element 24 extends from one of a pair of the terminals 24a and 24b disposed on the central portion of the ceramic plate 20, is folded at folded portions in a one-stroke pattern, is wired over the substantially entire outer-peripheral-side first zone Z21, and reaches the other of the pair of the terminals 24a and 24b. The outer-peripheral-side second resistance heating element 26 extends from one of a pair of the terminals 26a and 26b disposed on the central portion of the ceramic plate 20, is folded at folded portions in a one-stroke pattern, is wired over the substantially entire outer-peripheral-side second zone Z22, and reaches the other of the pair of the terminals 26a and 26b. The outer-peripheral-side third resistance heating element 28 extends from one of a pair of the terminals 28a and 28b disposed on the central portion of the ceramic plate 20, is folded at folded portions in a one-stroke pattern, is wired over the substantially entire outer-peripheral-side third zone Z23, and reaches the other of the pair of the terminals 28a and 28b. The outer-peripheral-side first to third resistance heating elements 24, 26, and 28 are coils that are manufactured by using high-melting-point metal or carbide thereof. However, an extension wire from the terminals 24a and 24b to the outer-peripheral-side first zone Z21, an extension wire from the terminals 26a and 26b to the outer-peripheral-side second zone Z22, and an extension wire from the terminals 28a and 28b to the outer-peripheral-side third zone Z23 are not coils but are manufactured as ribbons with wiring lines or by printing.

The tubular shaft 40 is composed of ceramics such as aluminum nitride or alumina as in the ceramic plate 20. The inner diameter of the tubular shaft 40 is, for example, about 40 mm, and the outer diameter thereof is, for example, about 60 mm. The upper end of the tubular shaft 40 is diffusion-joined to the ceramic plate 20. As illustrated in FIG. 2, power supply rods 42a and 42b that are connected to the respective terminals 22a and 22b of the inner-peripheral-side resistance heating element 22 are disposed in the tubular shaft 40. Power supply rods 44a and 44b that are connected to the respective terminals 24a and 24b of the outer-peripheral-side first resistance heating element 24, power supply rods 46a and 46b that are connected to the respective terminals 26a and 26b of the outer-peripheral-side second resistance heating element 26, power supply rods 48a and 48b that are connected to the respective terminals 28a and 28b of the outer-peripheral-side third resistance heating element 28 are disposed in the tubular shaft 40. The power supply rods 42a and 42b are connected to an inner-peripheral-side power supply 32, the power supply rods 44a and 44b are connected to an outer-peripheral-side first power supply 34, the power supply rods 46a and 46b are connected to an outer-peripheral-side second power supply 36, and the power supply rods 48a and 48b are connected to an outer-peripheral-side third power supply 38. This enables separate temperature control of the inner-peripheral-side zone Z1 that is heated by the inner-peripheral-side resistance heating element 22 and the outer-peripheral-side zones Z21, Z22, and Z23 that are heated by the outer-peripheral-side first to third resistance heating elements 24, 26, and 28.

An example of the use of the ceramic heater 10 will now be described. The ceramic heater 10 is first installed in the vacuum chamber not illustrated, and a wafer W is placed on the wafer placement surface 20a of the ceramic heater 10. The inner-peripheral-side power supply 32 adjusts power that is supplied to the inner-peripheral-side resistance heating element 22 such that the temperature of the inner-peripheral-side zone Z1 that is detected by an inner-peripheral-side thermocouple not illustrated becomes a predetermined inner-peripheral-side target temperature. The outer-peripheral-side first to third power supplies 34, 36, and 38 adjust power that is supplied to the outer-peripheral-side first to third resistance heating elements 24, 26, and 28 such that the temperatures of the outer-peripheral-side first to third zones Z21 to Z23 that are detected by outer-peripheral-side first to third thermocouples not illustrated become predetermined outer-peripheral-side first to third target temperatures. Consequently, the temperature of the wafer W is controlled so as to be the desired temperature. Settings are adjusted such that the interior of the vacuum chamber becomes a vacuum atmosphere or a decompression atmosphere, plasma is produced in the vacuum chamber, a CVD film is formed on the wafer W by using the plasma, and etching is performed.

As for the ceramic heater 10 according to the present embodiment described above, the outer-peripheral-side first to third resistance heating elements 24, 26, and 28 that have a coil shape are disposed in the outer-peripheral-side zone Z2 (the outer-peripheral-side first to third zones Z21 to Z23), and a relatively large amount of heat generation can be obtained. Since the shape of the inner-peripheral-side resistance heating element 22 is not a coil shape but is a two-dimensional shape, the line width can be decreased, and the line distance can be decreased. Accordingly, temperature variance can be inhibited from occurring in the inner-peripheral-side zone Z1.

The inner-peripheral-side resistance heating element 22 is wired over the entire inner-peripheral-side zone Z1 via spaces between the terminals 22a, 22b, 24a, 24b, 26a, 26b, 28a, and 28b. According to the present embodiment, the shape of the inner-peripheral-side resistance heating element 22 is a two-dimensional shape, and accordingly, the line width can be decreased, and the line distance can be decreased. For this reason, the inner peripheral-side resistance heating element 22 can be wired over the entire inner-peripheral-side zone Z1 via the spaces between the terminals.

The area of the inner-peripheral-side zone Z1 is smaller than the area of the outer-peripheral-side zone Z2. Even in this case, the inner-peripheral-side resistance heating element 22 can be wired over the entire inner-peripheral-side zone Z1 because the inner-peripheral-side resistance heating element 22 has a two-dimensional shape, the line width can be decreased, and the line distance can be decreased.

The outer-peripheral-side zone Z2 is divided into the three outer-peripheral-side first to third zones Z21 to Z23, and accordingly, the outer-peripheral-side first to third resistance heating elements 24, 26, and 28 are separately wired in the respective zones. For this reason, eight terminals in total are disposed in the inner-peripheral-side zone Z1. Even in this case, the inner-peripheral-side resistance heating element 22 can be wired over the entire inner-peripheral-side zone Z1 because the inner-peripheral-side resistance heating element 22 has a two-dimensional shape, the line width can be decreased, and the line distance can be decreased.

It is without saying that the present invention is not limited to the embodiment described above, and that various embodiments can be carried out provided that the embodiments are included in the technical range of the present invention.

For example, according to the embodiment described above, the electric resistance between the terminals of the inner-peripheral-side resistance heating element 22 may be set to be higher than electric resistance between the terminals of the outer-peripheral-side first to third resistance heating elements 24, 26, and 28 in a manner in which the electric resistance between the terminals of the inner-peripheral-side resistance heating element 22 is changed by a sectional area of the inner-peripheral-side resistance heating element 22 or the length of the wiring line. Alternatively, the electric resistance between the terminals of the inner-peripheral-side resistance heating element 22 may be set to be lower than or may be set to be equal to the electric resistance between the terminals of the outer-peripheral-side first to third resistance heating elements 24, 26, and 28. In this way, the amount of heat generation of the inner-peripheral-side resistance heating element 22 in the inner-peripheral-side zone Z1 can be appropriately set depending on a user request.

According to the embodiment described above, the outer-peripheral-side zone Z2 is divided into the three small zones. However, the outer-peripheral-side zone Z2 may be a single zone, may be divided into two small zones, or may be divided into four or more small zones. In any case, the resistance heating elements are separately wired for every zone. Each small zone may be formed into an annular shape by dividing the outer-peripheral-side zone Z2 by a boundary line concentric with the ceramic plate 20 as described according to the embodiment or may be formed into a sectorial shape (a shape obtained by unfolding the side surface of a truncated cone) by dividing the outer-peripheral-side zone Z2 by lines radially extending from the center of the ceramic plate 20.

According to the embodiment described above, the inner-peripheral-side zone Z1 is described as a single zone but may be divided into small zones. In this case, the resistance heating elements that have a two-dimensional shape are separately wired for every small zone. Each small zone may be formed into an annular shape and a circular shape by dividing the inner-peripheral-side zone Z1 by a boundary line concentric with the ceramic plate 20 or may be formed into a sectorial shape (a shape obtained by unfolding the side surface of a cone) by dividing the inner-peripheral-side zone Z1 by lines radially extending from the center of the ceramic plate 20.

According to the embodiment described above, in the case where the electric resistance between the terminals of the resistance heating elements 22, 24, 26, and 28 is to be increased, a material that has high volume resistivity may be used. Examples of the volume resistivity at 20° C. are $5.5 \times 10^6$ [Ω·m] for tungsten and $53 \times 10^6$ [Ω·m] for tungsten carbide. For this reason, the use of tungsten carbide enables the electric resistance between the terminals to be higher than that in the case of using tungsten.

According to the embodiment described above, the ceramic plate 20 may contain an electrostatic electrode. In this case, the wafer W can be electrostatically sucked and held on the wafer placement surface 20a by applying a voltage to the electrostatic electrode after the wafer W is placed on the wafer placement surface 20a. The ceramic plate 20 may contain a RF electrode. In this case, a shower head, not illustrated, is disposed with a space created above the wafer placement surface 20a, and high-frequency power is supplied between parallel flat plate electrodes including the shower head and the RF electrode. In this way, plasma is produced, a CVD film can be formed on the wafer W by using the plasma, and etching can be performed. The electrostatic electrode may double as the RF electrode.

According to the embodiment described above, the inner-peripheral-side resistance heating element 22 is wired over the entire inner-peripheral-side zone Z1 via the spaces between the terminals but is not particularly limited thereto. For example, the inner-peripheral-side resistance heating element 22 may be wired over the entire inner-peripheral-side zone Z1 so as not to pass through the spaces between the terminals.

The present application claims priority from Japanese Patent Application No. 2019-011301, filed on Jan. 25, 2019, the entire contents of which are incorporated herein by reference.

What is claimed is:

1. A ceramic heater comprising:
a ceramic plate that has a wafer placement surface and that has an inner-peripheral-side zone that has a circular shape and an outer-peripheral-side zone that has an annular shape;
an inner-peripheral-side resistance heating element that is disposed in the inner-peripheral-side zone and that has a two-dimensional shape and at least two terminals; and
an outer-peripheral-side resistance heating element that is disposed in the outer-peripheral-side zone and that has a coil shape and t least two terminals,
wherein at least two terminals of the inner-peripheral-side resistance heating element and at least two terminals of the outer-peripheral-side resistance heating element are disposed in the inner-peripheral-side zone, and
wherein the inner-peripheral-side resistance heating element is wired over an entirety of the inner-peripheral-side zone via a space between the at least two terminals of the inner-peripheral-side resistance heating element and the at least two terminals of the outer-peripheral-side resistance heating element, and
wherein the inner-peripheral-side resistance heating element extends from the at least two terminals of the inner-peripheral-side resistance heating element and passes through spaces between the at least two terminals of the inner-peripheral-side resistance heating element and the at least two terminals of the outer-peripheral-side resistance heating element.

2. The ceramic heater according to claim 1,
wherein an area of the inner-peripheral-side zone is smaller than an area of the outer-peripheral-side zone.

3. The ceramic heater according to claim 1,
wherein the inner-peripheral-side resistance heating element and the outer-peripheral-side resistance heating element are disposed on the same plane parallel with the wafer placement surface in the ceramic plate.

4. The ceramic heater according to claim 1,
wherein the inner-peripheral-side zone is a single zone, and
wherein the outer-peripheral-side zone is divided into two or more zones, and the outer-peripheral-side resistance heating element is separately wired for every zone.

* * * * *